United States Patent
Pan et al.

(10) Patent No.: US 8,369,798 B2
(45) Date of Patent: Feb. 5, 2013

(54) LINEARIZED TRANSMITTER INCLUDING A POWER AMPLIFIER

(75) Inventors: Meng-An Pan, Irvine, CA (US); Ali Afsahi, San Diego, CA (US); Vikram Magoon, San Diego, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 136 days.

(21) Appl. No.: 13/031,331

(22) Filed: Feb. 21, 2011

(65) Prior Publication Data

US 2011/0143791 A1    Jun. 16, 2011

Related U.S. Application Data

(63) Continuation of application No. 11/762,573, filed on Jun. 13, 2007, now Pat. No. 7,894,780.

(60) Provisional application No. 60/868,818, filed on Dec. 6, 2006.

(51) Int. Cl.
    *H04B 1/40* (2006.01)
(52) U.S. Cl. .................... 455/78; 455/73; 455/88
(58) Field of Classification Search .......... 455/91, 455/127.2, 127.3, 114.1, 114.3, 118, 125, 455/115.1, 73, 333, 78, 88
    See application file for complete search history.

(56) References Cited

U.S. PATENT DOCUMENTS

| 7,257,379 | B2 * | 8/2007 | Ozluturk et al. | 455/73 |
| 7,894,782 | B2 * | 2/2011 | Rofougaran | 455/127.2 |
| 8,090,327 | B2 * | 1/2012 | Rofougaran | 455/78 |
| 8,238,841 | B2 * | 8/2012 | Chiu et al. | 455/78 |
| 2009/0227214 | A1 * | 9/2009 | Georgantas et al. | 455/86 |

* cited by examiner

*Primary Examiner* — Sonny Trinh
(74) *Attorney, Agent, or Firm* — Thomas | Horstemeyer, LLP

(57) ABSTRACT

A method and system for wireless communication is provided and may include generating a single analog quadrature signal in a chip including RF transmitters and receivers using a baseband processor, and generating output RF signals based on the quadrature signal in corresponding RF transmitters. The output RF signals may be communicated to the RF receivers via a feedback path including circuitry external to the RF receivers. The dedicated circuitry may include a transmit/receive switch and/or an on-chip or off-chip balun. The quadrature signal may include in-phase and quadrature-phase components. The output RF signal communicated via the feedback path may be down-converted utilizing mixers in the RF receivers and communicated to the baseband processor. Distortion in the quadrature signal may be estimated utilizing the communicated down-converted output RF signals and subsequently generated quadrature signals may be predistorted based on the distortion estimation.

20 Claims, 4 Drawing Sheets

LINEARIZED TRANSMITTER INCLUDING A POWER AMPLIFIER

CROSS-REFERENCE TO RELATED APPLICATIONS/INCORPORATION BY REFERENCE

This application is a continuation of U.S. application Ser. No. 11/762,573 filed Jun. 13, 2007, which makes reference to, and claims the benefit of U.S. Provisional Application Ser. No. 60/868,818, filed on Dec. 6, 2006.

This application makes reference to U.S. patent application Ser. No. 11/618,876, filed on Dec. 31, 2006.

Each of the above stated applications is hereby incorporated herein by reference in its entirety.

FIELD OF THE INVENTION

Certain embodiments of the invention relate to wireless communications. More specifically, certain embodiments of the invention relate to a method and system for a linearized transmitter including a power amplifier.

BACKGROUND OF THE INVENTION

Power amplifier (PA) circuits, which are utilized in wireless local area network (WLAN) systems, may be required to operate over a wide range of frequencies. Throughout most of the world, WLAN systems operate in the industrial scientific and industrial (ISM), and/or unlicensed national information infrastructure (U-NII) frequency bands. The ISM band comprises 2.4-2.4835 GHz and 5.725-5.85 GHz frequency ranges, while the U-NII band comprises 5.15-5.25 GHz, 5.25-5.35 GHz and 5.725-5.825 GHz frequency ranges. The IEEE has adopted a series of resolutions 802.11, which specify allowable frequency bands for use in WLAN systems and devices. The IEEE 802.11 resolutions define a 2.4 GHz frequency band, and a 5 GHz frequency band. The 2.4 GHz frequency band comprises the 2.4-2.4835 GHz portion of the ISM band. The 5 GHz frequency band comprises the U-NII frequency band. IEEE 802.11b and IEEE 802.11 g comprise specifications for the operation of WLAN systems and devices for the 2.4 GHz frequency band, while IEEE 802.11a comprises specifications for the operation of WLAN systems and devices for the 5 GHz frequency band.

A PA circuit in a wireless system is typically a large signal device. In WLAN systems, the PA circuit may transmit output signals at average power levels in the range of 10 dBm to 15 dBm, and peak power levels of about 25 dBm, for example. In WLAN systems, which use OFDM or CCK modulation, output power levels may vary widely such that the ratio of the peak power level to the average power level may be large, for example, 12 dB for OFDM and 6 dB for CCK. Because of these large swings in output power levels, PA circuits may distort the output signal. Distortion, however, is a characteristic, which may be observed in PA circuits that are utilized across a wide range of applications, and may not be limited to PA circuits utilized in wireless systems. There are two metrics, which may be utilized to evaluate the distortion performance of PA circuits. These metrics may be referred to as amplitude modulation to amplitude modulation (AM-AM) distortion, and amplitude modulation to phase modulation (AM-PM) distortion.

The AM-AM distortion provides a measure of the output power level, $p_{out}$, in response to the input power level, $p_{in}$. The input power level, and output power level are each typically measured in units of dBm, for example. In an ideal, non-distorting, PA circuit, the output power level changes linearly in response to a change in the input power level. Thus, for each $\Delta p_{in}$ change in the input power level there may be a corresponding change in the output power level $\Delta p_{out}$. The AM-AM distortion may be observed when, for example, the output power level in response to a first input power level may be $p_{out1} \approx \alpha p_{in1}$, where the output level in response to a second input power level may be $p_{out2} \approx \beta p_{in2}$, when $\alpha \neq \beta$.

The AM-PM distortion provides a measure of the phase of the output signal in relation to the input signal (or output phase) in response to the input power level. Output phase is typically measured in units of angular degrees. The AM-PM distortion may be observed when, for example, the output phase changes in response to a change in input power level.

Limitations in the performance of PA circuitry due to distortion may be exacerbated when the PA is integrated in a single integrated circuit (IC) device with other radio frequency (RF) transmitter circuitry [such as digital to analog converters (DAC), low pass filters (LPF), mixers, and RF programmable gain amplifiers (RFPGA)]. Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification.

The AM-AM distortion and/or the AM-PM distortion comprise transmitter impairments that may result in signal transmission errors that may result in unintentional and/or undesirable modifications in the magnitude and/or phase of transmitted signals. When transmitting quadrature RF signals, the AM-AM distortion and/or the AM-PM distortion may cause unintentional and/or undesirable modifications in the magnitude and/or phase of the I components and/or Q components in the transmitted signals.

The transmission of erroneous signals from an RF transmitter may result in erroneous detection of data contained within the received signals at an RF receiver. The result may be reduced communications quality as measured, for example, by packet error rate (PER), and/or bit error rate (BER).

Communications standards may specify a limit for Error Vector Magnitude (EVM) in a transmitted signal. For example, IEEE 802.11 g standard for WLAN communications specifies that $EVM_{dB}$ for a 54 Mbps transmitted signal may be no greater than −25 dB. Thus, some conventional RF transmitters may be required to limit the peak power level for signals generated by the PA to ensure that the transmitted signals comply with EVM specifications. One potential limitation imposed by the reduced output power level is the reduced operating range in wireless communications. In this regard, the EVM specification may reduce the allowable distance between a transmitting antenna and a receiving antenna for which signals may be transmitted from an RF transmitter and received by an RF receiver, in relation to the operating range that would be theoretically possible if the RF transmitter were able to transmit signals at the maximum, or saturation, output power level that could be generated by the PA.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for a linearized transmitter including a power amplifier, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a linearized transmitter including a power amplifier. Various embodiments of the invention may comprise a multiband RF transmitter that receives a digital baseband signal. The received digital baseband signal may be subsequently converted to an analog representation and filtered to generate a quadrature signal. The multiband RF transmitter may then utilize the single quadrature signal to generate a plurality of RF output signals, where each of the RF output signals comprises a frequency selected from distinct frequency bands. In an exemplary multiband RF transmitter utilized in an WLAN system, one of the plurality of RF output signals may comprise a frequency selected from the 2.4 GHz frequency band, while a second one of the plurality of RF output signals may comprise a frequency selected from the 5 GHz frequency band.

In some conventional systems, multiple RF output signals from distinct frequency bands may be generated by a corresponding plurality of transmitter chains, where each of the transmitter chains may comprise circuitry the receives a digital baseband signal and generates a single analog RF output signal among the plurality of RF output signals.

Various embodiments of the invention may comprise a demarcation point, which may divide the transmitter chain into a transconductance stage and a gain stage. The transconductance stage may receive a single digital baseband signal and generate a single analog quadrature signal. The gain stage may receive a single quadrature signal and generate a single RF output signal. In various embodiments of the invention, a multiband RF transmitter may generate a plurality of RF output signals by utilizing a single transconductance stage, and a plurality of gain stages, where the number of gain stages may be equal to the number of RF output signals. In such various embodiments of the invention, the quadrature signal output from the transconductance stage may be input to each of the gain stages. Each gain stage may then generate a corresponding one of the plurality of RF output signals.

Figure 1:
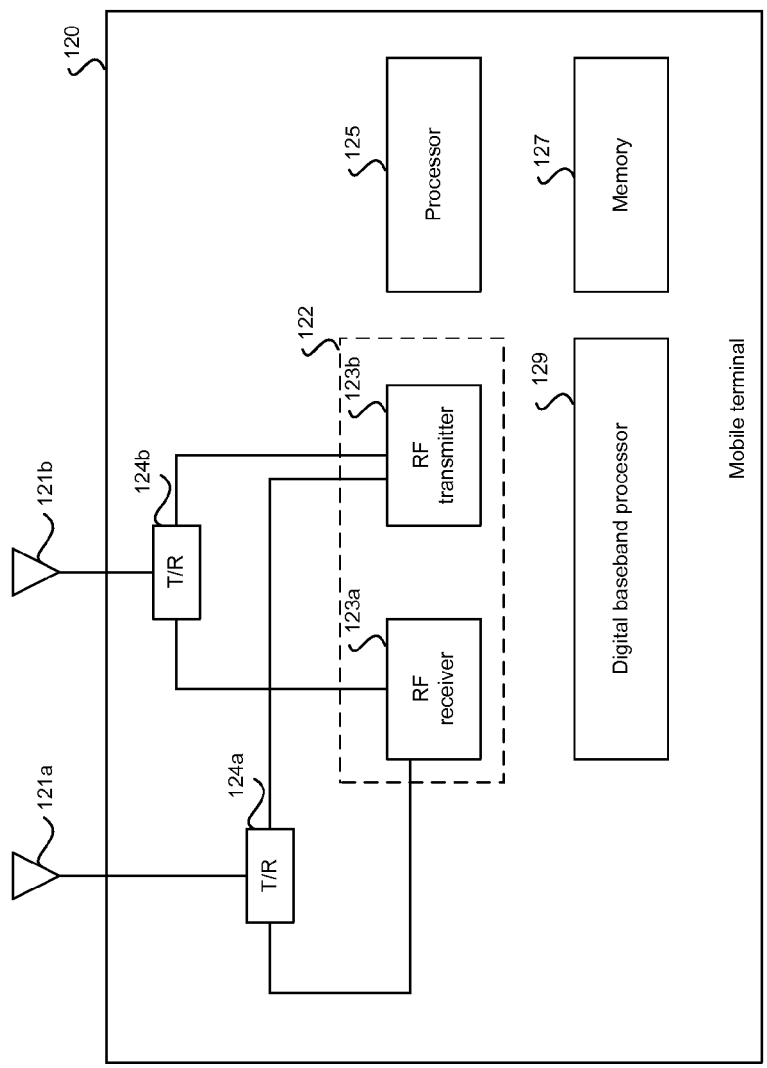
FIG. 1 is a block diagram illustrating and exemplary multiband mobile terminal, which may be utilized in connection with an embodiment of the invention.

FIG. 1 is a block diagram illustrating and exemplary multiband mobile terminal, which may be utilized in connection with an embodiment of the invention. Referring to FIG. 1, there is shown mobile terminal 120 and a plurality of antennas 121a and 121b. The mobile terminal 120 may comprise a multiband RF transceiver 122, a digital baseband processor 129, a processor 125, a memory 127, and a plurality of switches 124a and 124b. The multiband RF transceiver 122 may comprise a multiband RF receiver 123a, and a multiband RF transmitter 123b. The antenna 121a may enable the transmission and/or reception of signals within one of a plurality of RF frequency ranges. The antenna 121b may enable the transmission and/or reception of signals within a distinct one of the plurality of RF frequency ranges. The transmit and receive antenna 121a may be communicatively coupled to the multiband RF receiver 123a and the multiband RF transmitter 123b via the switch 124a. The transmit and receive antenna 121b may be communicatively coupled to the multiband RF receiver 123a and the multiband RF transmitter 123b via the switch 124b. The switch 124a may be utilized to switch the antenna 121a between transmit and receive functions. The switch 124b may be utilized to switch the antenna 121b between transmit and receive functions.

The multiband RF transmitter 123b may comprise suitable logic, circuitry, and/or code that may enable processing of one or more RF signals for transmission. A plurality of RF signals may be transmitted, each within a distinct frequency range. The multiband RF transmitter 123b may enable transmission of RF signals in frequency bands utilized by various wireless communications systems, such as GSM and/or CDMA, for example.

The multiband RF receiver 123a may comprise suitable logic, circuitry, and/or code that may enable processing of received RF signals within one or more distinct frequency ranges. The multiband RF receiver 123a may enable receiving RF signals in frequency bands utilized by various wireless communication systems, such as WLAN, Bluetooth, GSM and/or CDMA, for example.

The digital baseband processor 129 may comprise suitable logic, circuitry, and/or code that may enable processing and/or handling of digital baseband signals. In this regard, the digital baseband processor 129 may process or handle signals received from the multiband RF receiver 123a and/or signals to be transferred to the multiband RF transmitter 123b for transmission via a wireless communication medium. The digital baseband processor 129 may also provide control and/or feedback information to the multiband RF receiver 123a and to the multiband RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the multiband RF transmitter 123b for transmission via the wireless communication medium.

The processor 125 may comprise suitable logic, circuitry, and/or code that may enable control and/or data processing operations for the mobile terminal 120. The processor 125 may be utilized to control at least a portion of the multiband RF receiver 123a, the multiband RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, which may be utilized to control the operation of at least one block in the mobile terminal 120. For example, the memory 127 may comprise information necessary to configure the multiband RF receiver 123a to enable receiving RF signals in the appropriate frequency band(s).

In an exemplary embodiment of a transmitting mobile terminal 120, the mobile terminal 120 may comprise a multiband RF transmitter 123b, a digital baseband processor 129, a processor 125, a memory 127, and a plurality of switches 124a and 124b, for example. In an exemplary embodiment of a receiving mobile terminal 120, the mobile terminal 120 may comprise a multiband RF receiver 123a, a digital baseband processor 129, a processor 125, a memory 127, and a plurality of switches 124a and 124b, for example.

Figure 2:
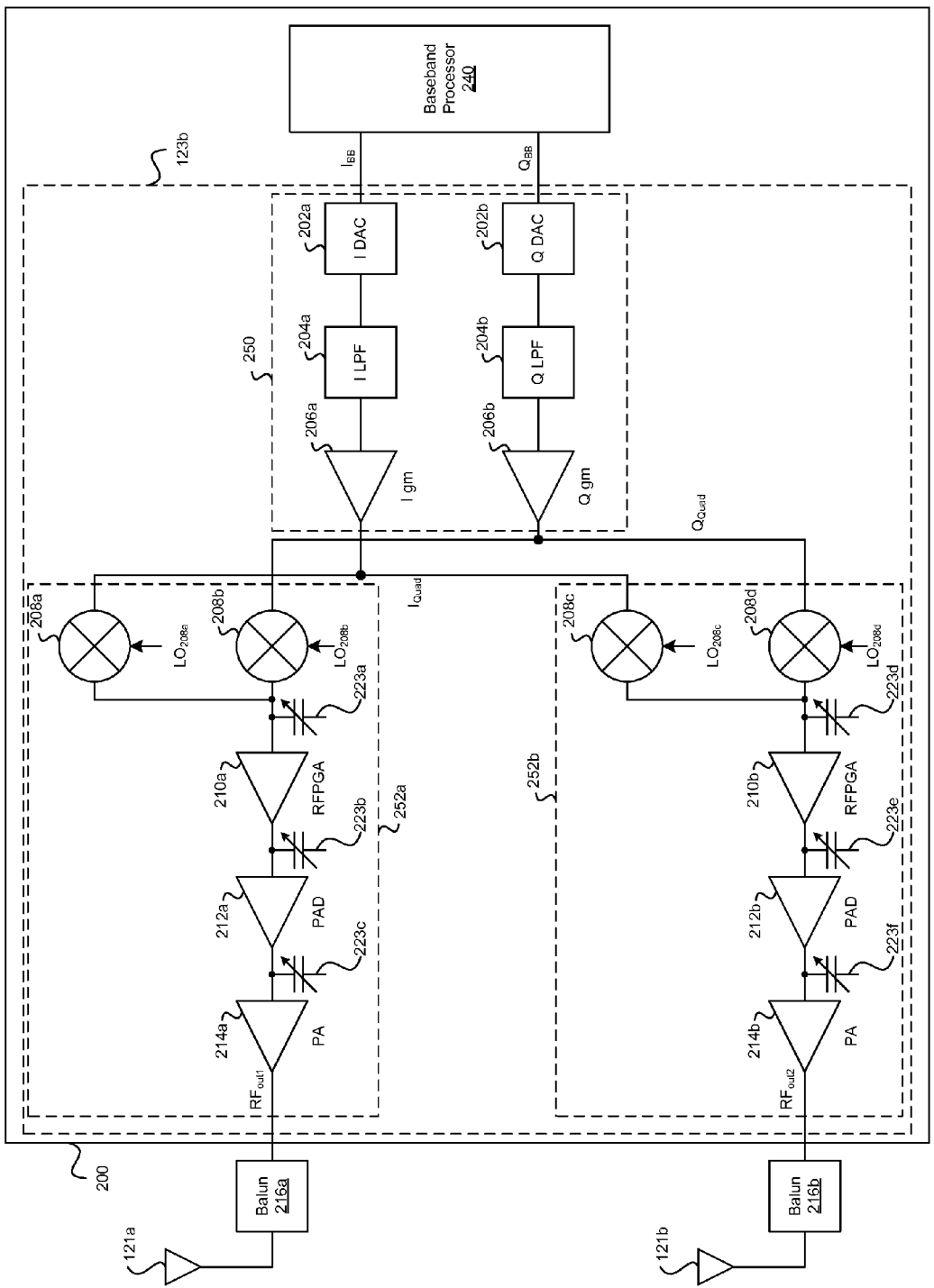
FIG. 2 is a block diagram of an exemplary multiband RF transmitter, in accordance with an embodiment of the invention.

FIG. 2 is a block diagram of an exemplary multiband RF transmitter, in accordance with an embodiment of the invention. Referring to FIG. 2, there is shown a single chip RF transmitter 200, baluns 216a and 216b, and antennas 121a and 121b. The single chip RF transmitter 200 may comprise a multiband RF transmitter 123b, and a baseband processor 240. The multiband RF transmitter 123b may comprise a transconductance stage 250 and a plurality of gain stages 252a and 252b. The gain stage 252a may comprise a power amplifier (PA) 214a, a power amplifier driver (PAD) 212a, an RF programmable gain amplifier (RFPGA) 210a, a transmitter In-phase signal (I) mixer 208a, a transmitter Quadrature-phase signal (Q) mixer 208b, and a plurality of tunable capacitors 223a, 223b and 223c. The gain stage 252b may comprise a PA 214b, PAD 212b, RFPGA 210b, I mixer 208c, Q mixer 208d, and a plurality of tunable capacitors 223d, 223e and 223f. The transconductance stage 250 may comprise, an I transconductance amplifier (gm) 206a, a Q gm 206b, an I low pass filter (LPF) 204a, a Q LPF 204b, an I digital to analog converter (I DAC) 202a, and a Q DAC 202b.

The transconductance stage 250 may comprise suitable logic, circuitry and/or code that may enable generation of an analog quadrature signal based on an input digital baseband signal. The analog quadrature signal may comprise an I component signal and a Q component signal.

The gain stage 252a may comprise suitable logic, circuitry and/or code that may enable generation of an RF output signal based on an analog input quadrature signal. The gain stage 252a may generate the RF output signal by upconverting the analog input quadrature signal based on a carrier frequency selected from a frequency range, for example a 2.4 GHz frequency range. The upconverted signal may be amplified through one or more amplification stages and output as the RF output signal.

The gain stage 252b may be substantially similar to the gain stage 252a. The gain stage 252b may generate an RF output signal by upconverting the input quadrature signal based on a carrier frequency selected from a different frequency range from that selected in the gain stage 252a, for example a 5 GHz frequency range.

The PA 214a may comprise suitable logic, circuitry, and/or code that may enable amplification of input signals to generate a transmitted signal of sufficient signal power (as measured by dBm, for example) for transmission via a wireless communication medium. The PA 214b may be substantially similar to the PA 214a.

The PAD 212a may comprise suitable logic, circuitry, and/or code that may enable amplification of input signals to generate an amplified output signal. The PAD 212a may be utilized in multistage amplifier systems wherein the output of the PAD 212a may be an input to a subsequent amplification stage. The PAD 212b may be substantially similar to the PAD 212a.

The RFPGA 210a may comprise suitable logic, circuitry, and/or code that may enable amplification of input signals to generate an amplified output signal, wherein the amount of amplification, as measured in dB, may be determined based on an input control signal. In various embodiments of the invention, the input control signal may comprise binary bits. The RFPGA 210b may be substantially similar to the RFPGA 210a.

The transmitter I mixer 208a may comprise suitable logic, circuitry, and/or code that may enable generation of an RF signal by upconversion of an input signal. The transmitter I mixer 208a may utilize an input local oscillator signal labeled as $LO_{208a}$ to upconvert the input signal. The upconverted signal may be an RF signal. The transmitter I mixer 208a may produce an RF signal for which the carrier frequency may be equal to the frequency of the signal $LO_{208a}$. The carrier frequency may be selected from a frequency range, for example, a 2.4 GHz frequency range. The selected carrier frequency may be a center frequency for the RF signal generated by the transmitter I mixer 208a.

The transmitter Q mixer 208b may be substantially similar to the transmitter I mixer 208a. The frequency of the input local oscillator signal $LO_{208b}$ may be equal to the frequency of the local oscillator signal $LO_{208a}$, however, the local oscillator signal $LO_{208b}$ may have a different phase in relation to the local oscillator signal $LO_{208a}$. For example, the phase of the local oscillator signal $LO_{208b}$ may be shifted 90° relative to the local oscillator signal $LO_{208a}$.

The tunable capacitor 223a may be coupled to a signal within the gain stage 252a. Tuning of the tunable capacitor 223a may enable a changing of the capacitance value of the tunable capacitor 223a along with a corresponding modification of the center frequency of the coupled signal. The tunable capacitors 223b, 223c, 223d, 223e and 223f may be substantially similar to the tunable capacitor 223a.

The I gm 206a may comprise suitable, logic, circuitry, and/or code that may enable generation of an output current, the amplitude of which may be proportional to an amplitude of an input voltage to the I gm 206a. A measure of proportionality between input voltage and output current may be determined based on the transconductance parameter, $gm_I$, associated with the I gm 206a. The Q gm 206b may be substantially similar to the I gm 206a. The transconductance parameter associated with the Q gm 206b is $gm_Q$.

The I LPF 204a may comprise suitable logic, circuitry, and/or code that may enable selection of a cutoff frequency, wherein the LPF may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the I LPF 210a may be implemented as a passive filter, such as one that utilizes resistor, capacitor, and/or inductor elements, or implemented as an active filter, such as one that utilizes an operational amplifier. In an exemplary embodiment of the invention, the I LPF 210a may receive a differential input signal and output a differential output signal. The Q LPF 204b may be substantially similar to the I LPF 204a.

The I DAC 202a may comprise suitable logic, circuitry, and/or code that may enable conversion of an input digital signal to a corresponding analog representation. The Q DAC 202b may be substantially similar to the I DAC 202a.

The baseband processor 240 may comprise suitable logic, circuitry, and/or code that may enable processing of binary data contained within an input digital baseband signal. The baseband processor 240 may perform processing tasks, which correspond to one or more layers in an applicable protocol reference model (PRM). For example, the baseband processor 240 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 240 may be referred to as being within the digital domain. The baseband processor 240 may also generate control signals based on the processing of the input binary data.

In operation, the multiband RF transmitter 123b may receive a digital baseband signal from the baseband processor 240. The digital baseband signal may comprise an I component, $I_{BB}$, and a Q component, $Q_{BB}$. Signal $I_{BB}$ may be input to the I DAC 202a while the signal $Q_{BB}$ may be input to the Q DAC 202b.

The analog signals generated by the I DAC 202a and the Q DAC 202b may comprise undesirable frequency components. The I LPF 204a and Q LPF 204b may attenuate signal amplitudes associated with these undesirable frequency components.

The I gm 206a may receive the filtered signal from the I LPF 204a and generate an I component signal, $I_{Quad}$, of an analog quadrature signal output from the transconductance stage 250. The Q gm 206b may receive the filtered signal from the Q LPF 204b and generate a Q component signal, $Q_{Quad}$, of the analog quadrature signal output from the transconductance stage 250.

The gain stage 252a may receive the analog quadrature signal from the transconductance stage 250. The baseband processor 240 may configure the transmitter I mixer 208a to select a carrier frequency for the $LO_{208a}$ signal. The carrier frequency $LO_{208a}$ may be selected from a frequency range, for example a 2.4 GHz frequency range. The $LO_{208a}$ may be utilized to upconvert the $I_{Quad}$ signal. The baseband processor 240 may also configure the transmitter Q mixer 208b to select a carrier frequency for the $LO_{208b}$ signal. The carrier frequency $LO_{208b}$ may be equal to the carrier frequency $LO_{208a}$. The $LO_{208b}$ may be utilized to upconvert the $Q_{Quad}$ signal. The upconverted $I_{Quad}$ and $Q_{Quad}$ signals may be combined to form a composite analog RF signal, $RF_{S1}$. The center frequency for the signal $RF_{S1}$ may be based on the carrier frequency $LO_{208a}$, for example. The tunable capacitor 223a may enable modification of the center frequency for the analog signal $RF_{S1}$. The frequency modified signal $RF_{S1}(LO_{208a}')$ may be received by the RFPGA 210a. The frequency modification, $\Delta f_1$, may be represented as in the following equations:

$$\Delta f_1 = LO'_{208a} - LO_{208a} \quad [1a]$$

where:

$$|\Delta f_1| \geq 0 \quad [1b]$$

The baseband processor 240 may configure the RFPGA 210a to amplify the signal $RF_{S1}(LO_{208a}')$ by a gain level, as measured in dB, for example. The RFPGA 210a may generate an amplified signal $RF_{S2}$. The tunable capacitor 223b may enable modification of the center frequency for the signal $RF_{S2}$. The frequency modified signal $RF_{S2}(LO_{208a}'')$ may be received by the PAD 212a. The frequency modification, $\Delta f_2$, may be represented as in the following equations:

$$\Delta f_2 = LO''_{208a} - LO'_{208a} \quad [2a]$$

where:

$$|\Delta f_2| \geq 0 \quad [2b]$$

The PAD 212a may amplify the signal $RF_{S2}(LO_{208a}'')$ by a gain level, as measured in dB, for example. The PAD 212a may generate an amplified signal $RF_{S3}$. The tunable capacitor 223c may enable modification of the center frequency for the signal $RF_{S3}$. The frequency modified signal $RF_{S3}(LO_{208a}''')$ may be received by the PA 214a. The frequency modification, $\Delta f_3$, may be represented as in the following equations:

$$\Delta f_3 = LO'''_{208a} - LO''_{208a} \quad [3a]$$

where:

$$|\Delta f_3| \geq 0 \quad [3b]$$

The values $\Delta f_1$, $\Delta f_2$ and/or $\Delta f_3$ may be independently determined.

The PA 214a may amplify the signal $RF_{S3}(LO_{208a}''')$ by a gain level, as measured in dB, for example. The PA 214a may generate an RF output signal $RF_{out1}$. The balun 216a may enable energy from the signal $RF_{out1}$ to be transferred to the antenna 121a from which the transferred signal energy may be transmitted via a wireless communication medium.

The operation of the gain stage 252b may be substantially similar to the operation of the gain stage 252a. The gain stage 252b may generate a signal $RF_{out2}$. Within the gain stage 252b, the I mixer 208c and Q mixer 208d may be configured to select a carrier frequency, represented by $LO_{208c}$ and $LO_{208d}$ respectively, which may be selected from a frequency range that is different from that utilized for selecting the carrier frequency, $LO_{208a}$ and $LO_{208b}$. For example, the carrier frequency for $LO_{208c}$ and $LO_{208d}$ may be selected from a 5 GHz frequency range. The tunable capacitor 223d may enable generation of a modification $\Delta f_4$, the value of which may be independent of the value of $\Delta f_1$, $\Delta f_2$, and/or $\Delta f_3$, for example. The tunable capacitor 223e may enable generation of a modification $\Delta f_5$, the value of which may be independent of the value of $\Delta f_1$, $\Delta f_2$, $\Delta f_3$ and/or $\Delta f_4$, for example. The tunable capacitor 223f may enable generation of a modification $\Delta f_6$, the value of which may be independent of the value of $\Delta f_1$, $\Delta f_2$, $\Delta f_3$, $\Delta f_4$ and/or $\Delta f_5$, for example.

Figure 3:
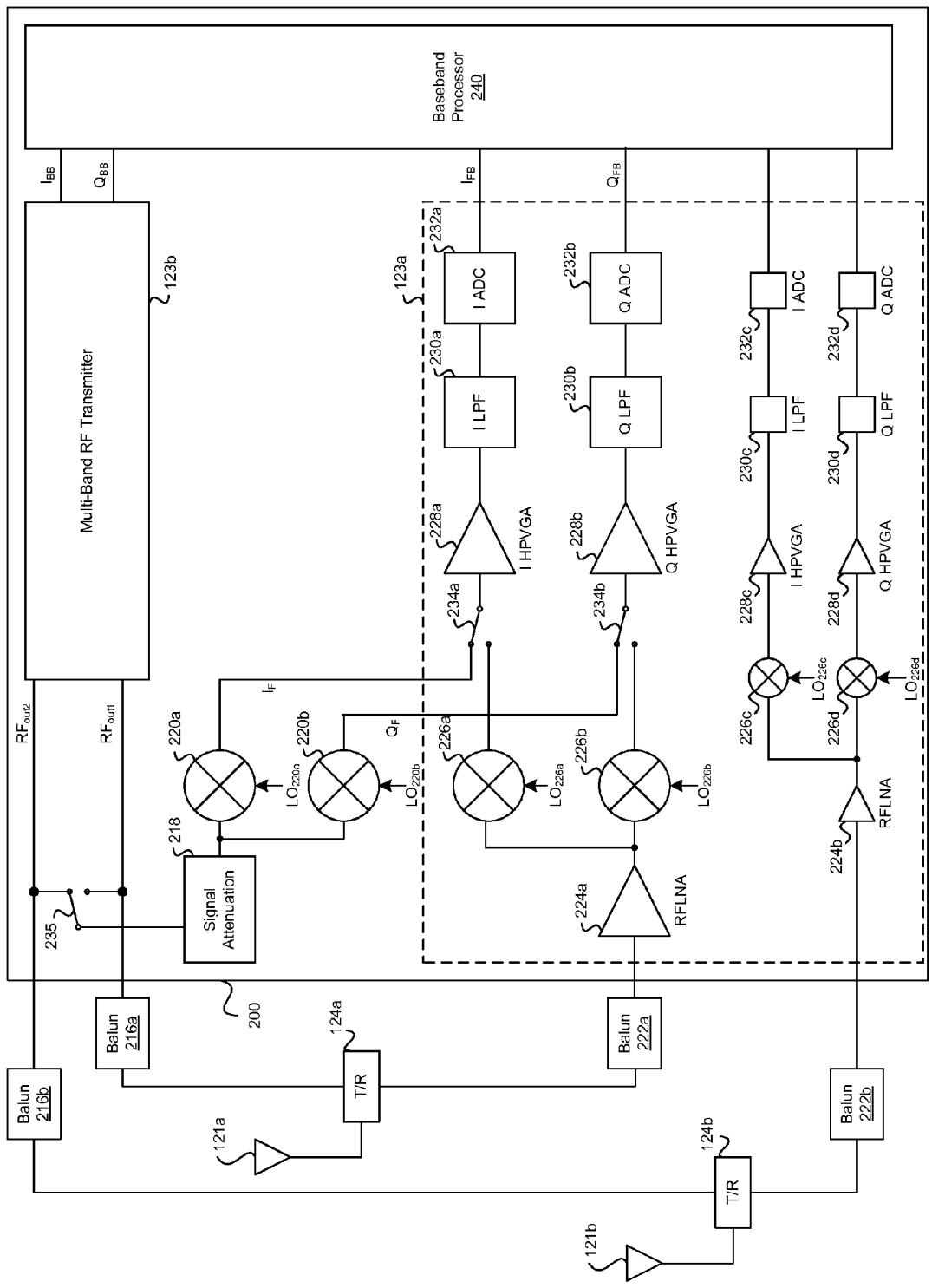
FIG. 3 is an exemplary block diagram illustrating a single chip RF transmitter and receiver utilizing feedback of the RF output from the transmitter through the receiver, in accordance with an embodiment of the invention.

FIG. 3 is an exemplary block diagram illustrating a single chip RF transmitter and receiver utilizing feedback of the RF output from the transmitter through the receiver, in accordance with an embodiment of the invention. FIG. 3 shows a system utilizing a feedback path from the RF output to the baseband processor 240 via the multiband receiver 123a. The feedback may be utilize to enable the baseband processor 240 to estimate AM-AM and/or AM-PM distortion in one or more of the plurality of RF output signals generated by the multiband RF transmitter 123b. After estimating the AM-AM and/or AM-PM distortion, the baseband processor 240 may digitally predistort subsequent baseband signals to linearize the PA circuits 214a and/or 214b within the multiband RF transmitter 123b.

Referring to FIG. 3, there is shown a single chip RF transceiver 300, baluns 216a, 216b, 222a and 222b, switches 124a and 124b, and antennas 121a and 121b. The antennas 121a and 121b, and switches 124a and 124b are described in FIG.

1. The single chip RF transceiver 300 may comprise a multiband RF receiver 123a, a multiband RF transmitter 123b, a signal attenuation block 218, a feedback I mixer 220a, a feedback Q mixer 220b, a baseband processor 240 and a switch 235. A detailed description of the multiband RF transmitter 123b may be found in FIG. 2. The multiband RF receiver 123a may comprise a plurality of RF low noise amplifiers (RFLNA) 224a and 224b, a plurality of receiver I mixers 226a and 226c, a plurality of receiver Q mixers 226b and 226d, an I path selector switch 234a, a Q path selector switch 234b, a plurality of I high pass variable gain amplifiers (HPVGA) 228a and 228c, a plurality of Q HPVGA 228b and 228d, a plurality of I LPFs 230a and 230c, a plurality of Q LPFs 230b and 230d, a plurality of I analog to digital converters (ADC) 232a and 232c, and a plurality of Q ADCs 232b and 232d.

In various embodiments of the invention, the baluns 216a, 216b, 222a and 222b may be integrated within the single chip RF transceiver 300. In various embodiments of the invention, electrical connections between components shown in FIG. 3 may be differential. In various other embodiments of the invention, electrical connections between components shown in FIG. 3 may be single ended.

The switch 235 may enable one of a plurality of inputs to be selectively coupled to an output. In an exemplary embodiment of the invention, the switch 235 may select from among 2 input signals, and couple the selected input signal to a single output. The I path selector switch 234a and the Q path selector switch 234b may be substantially similar to the switch 235.

The signal attenuation block 218 may comprise suitable logic, circuitry, and/or code that may enable generation of an output signal, the amplitude and/or power level of which may be based on an input signal after insertion of a specified level of attenuation. In various embodiments of the invention the attenuation level may be programmable over a range of attenuation levels. In an exemplary embodiment of the invention, the range of attenuation levels may comprise −32 dB to −40 dB, although various embodiments of the invention may not be limited to such a specific range.

The feedback I mixer 220a may comprise suitable logic, circuitry, and/or code that may enable downconversion of an input signal. The feedback I mixer 220a may utilize an input local oscillator signal labeled as $LO_{220a}$ to downconvert the input signal. The feedback Q mixer 220b may be substantially similar to the feedback I mixer 220a. The feedback Q mixer 220b may utilize an input local oscillator signal labeled $LO_{220b}$ to downconvert the input signal. In an exemplary embodiment of the invention, the phase of the local oscillator signal $LO_{220b}$ may be shifted 90° relative to the local oscillator signal $LO_{220a}$.

The RFLNA 224a may comprise suitable logic, circuitry, and/or code that may enable amplification of weak signals (as measured by dBm, for example), such as received from an antenna. The input signal to the RFLNA 224a may be an RF signal received at the antenna 121a, which is communicatively coupled to the RFLNA 224a through the balun 222a.

The receiver I mixer 226a may be substantially similar to the feedback I mixer 220a. The receiver I mixer 226a may utilize an input local oscillator signal labeled as $LO_{226a}$ to downconvert the input signal. The frequency for the signal $LO_{226a}$ may be selected from a frequency range, for example, a 2.4 GHz range.

The receiver Q mixer 226b may be substantially similar to the feedback Q mixer 220b. The receiver Q mixer 226b may utilize an input local oscillator signal labeled as $LO_{226b}$ to downconvert the input signal. The frequency of the signal $LO_{226b}$ may be equal to the frequency of the signal $LO_{226a}$, however the phase of the signal $LO_{226b}$ may be shifted 90° relative to the phase of the signal $LO_{226a}$, for example.

The I HPVGA 228a may comprise suitable logic, circuitry, and/or code that may enable attenuation of input signals to generate an attenuated output signal, wherein the amount of attenuation, as measured in dB for example, may be determined based on an input control signal. In various embodiments of the invention, the input control signal may comprise binary bits. In various embodiments of the invention, the HPVGA 228a may provide attenuation levels that range from 0 dB to −30 dB in 3 dB increments. The Q HPVGA 228b, I HPVGA 228c and Q HPVGA 228d may be substantially similar to the I HPVGA 228a.

The I LPF 230a, Q LPF 230b, I LPF 230c and Q LPF 230d may be substantially similar to the I LPF 204a.

The I ADC 232a may comprise suitable logic, circuitry, and/or code that may enable conversion of an input analog signal to a corresponding digital representation. The I ADC 232a may receive an input analog signal, which may be characterized by a signal amplitude. The I ADC 232a may quantize the analog signal by correlating ranges of analog signal level values to corresponding numerical values. The I ADC 232a may determine analog signal levels at distinct time instants by measuring, or integrating, the analog signal level of the input signal during a time interval referred to as δt. The time interval between measurements, or sampling interval, may be determined based on a sampling rate, which is typically long in comparison to the integration time interval δt. The Q ADC 232b, I ADC 232c and Q ADC 232d may be substantially similar to the I ADC 232a.

In operation, the baseband processor 240 may configure the multiband RF receiver 123a and/or multiband RF transmitter 123b for two distinct modes of operation comprising a normal operating mode, and a calibration mode. In the normal operating mode, the multiband RF transmitter 123b may transmit RF signals via the antennas 121a and/or 121b, while the multiband RF receiver 123a may receive RF signals via the antennas 121a and/or 121b. In the calibration mode, at least one of the plurality of RF output signals, $RF_{out1}$ and $RF_{out2}$, from the multiband RF transmitter 123b may be selectively coupled via the switch 235 to an input of the signal attenuation block 218. The selectively coupled RF output signal may be attenuated, downconverted into I and Q component signals, and inserted in the multiband RF receiver 123a as feedback signals. Thus, the calibration mode may enable a closed feedback loop from the baseband processor 240, to the multiband RF transmitter 123b, to a feedback point within the multiband RF receiver 123a, and back to the baseband processor 240.

As shown in FIG. 3, each selected RF output signal from the multiband RF transmitter 123b follows the feedback path through the I HPVGA 228a and Q HPVGA 228b, the I LPF 230a and Q LPF 230b, and the I ADC 232a and Q ADC 232b within the multiband RF receiver 123a. In various embodiments of the invention, each RF output signal may utilize a separate feedback path through the multiband RF receiver 123a to the baseband processor 240, or may utilize dedicated circuitry external to the multiband RF receiver 123a to establish one or more feedback paths from the RF output signals to the baseband processor 240.

Referring to FIG. 3, in a normal operating mode, the baseband processor 240 may generate control signals that enable configuration of the I path selector switch 234a such that I path selector switch 234a may be configured to select an input from the receiver I mixer 226a. The I path selector switch 234a may enable the output signal from the receiver I mixer 226a to be coupled to an input to the I HPVGA 228a. The baseband processor 240 may also generate control signals that enable configuration of the Q path selector switch 234b such that Q path selector switch 234b may be configured to select an input from the receiver Q mixer 226b. The Q path selector switch 234b may enable the output signal from the receiver Q mixer 226b to be coupled to an input to the Q HPVGA 228b.

In the normal operating mode, the multiband RF receiver 123a may receive RF signals via the antenna 121. The RFLNA 224 may amplify the received RF signal, which may then be sent to the receiver I mixer 226a, Q mixer 226b, I mixer 226c and/or receiver Q mixer 226d. The receiver I mixer 226a may downconvert the amplified RF signal. Similarly, the receiver Q mixer 226b may also downconvert the amplified RF signal. The I mixer 226a and Q mixer 226b may downconvert the amplified RF signal by utilizing a frequency selected from one of a plurality of frequency bands. For example, the frequency utilized by the I mixer 226a and Q mixer 226b may be selected from a 2.4 GHz frequency band.

While the receiver I mixer 226c and the receiver Q mixer 226d may also downconvert the amplified RF signal. The I mixer 226c and Q mixer 226d may downconvert the amplified RF signal by utilizing a frequency selected from a distinct one of the plurality of frequency bands. For example, the frequency utilized by the I mixer 226c and Q mixer 226d may be selected from a 5 GHz frequency band.

The baseband processor 240 may generate control signals that configure the I HPVGA 228a to amplify an I component portion of a received downconverted signal. In an exemplary embodiment of the invention, the I HPVGA 228a may amplify signal components for which the corresponding frequency may be higher than baseband. Similarly, the baseband processor 240 may generate control signals that configure the Q HPVGA 228b to amplify a Q component portion of the received downconverted signal. The I HPVGA 228c and Q HPVGA 228d may amplify I component and Q component portions of a distinct downconverted signal.

The I LPF 230a may filter the amplified signal received from the I HPVGA 228a such that the output of the I LPF 230a is an analog baseband signal. The analog baseband signal may comprise a sequence of symbols. Similarly, the Q LPF 230b may generate an analog baseband signal. The I LPF 230c and Q LPF 230d may filter amplified signals from the I HPVGA 228c and Q HPVGA 228d respectively.

The I ADC 232a may convert an amplitude of a symbol in the analog baseband signal received from the I LPF 230a to a sequence of bits. The sequence of bits may be contained in a digital baseband signal. Similarly, the Q ADC 232b may convert an amplitude of a symbol in the analog baseband signal received from the Q LPF 230b to a sequence of bits. The I ADC 232c may convert an amplitude of a symbol in the analog baseband signal received from the I LPF 230c to a sequence of bits. The Q ADC 232d may convert an amplitude of a symbol in the analog baseband signal received from the Q LPF 230d to a sequence of bits. The baseband processor 240 may receive the sequence of bits from the I ADC 232a and Q ADC 232b, and/or from the I ADC 232c and Q ADC 232d, and perform various processing tasks as set forth above.

In the calibration mode, the baseband processor 240 may generate control signals that may enable configuration of the I path selector switch 234a to select an input from the feedback I mixer 220a. The I path selector switch 234a may enable the output signal from the feedback I mixer 220a to be coupled to an input to the I HPVGA 228a. The baseband processor 240 may also generate control signals that may enable configuration of the Q path selector switch 234b to select an input from the feedback Q mixer 220b. The Q path selector switch 234b may enable the output signal from the feedback Q mixer 220b to be coupled to an input to the Q HPVGA 228b.

While the exemplary system illustrated in FIG. 3 shows 2 feedback mixers, various embodiments of the invention may also utilize a single feedback mixer. In various embodiments of the invention that utilize a single feedback mixer, the output from the single feedback mixer may be input to the I HPVGA 228a and Q HPVGA 228b, for example.

Referring to FIG. 3, in the calibration mode, the baseband processor 240 may generate control signals that may enable configuration of the switch 235 to perform selection of an RF output signal from the plurality of RF output signals, $RF_{out1}$ and $RF_{out2}$, generated by the multiband RF transmitter 123b. The selected RF output signal may be coupled to the input of the signal attenuation block 218 and utilized as a feedback signal. The signal attenuation block 218 may adjust the amplitude of the selected RF output signal to a level more suitable for input to the feedback mixers 220a and 220b. The signal attenuation block 218 may be configured by the baseband processor 240 to apply a specified attenuation level to the input signal selected from the multiband RF transmitter 123b. The feedback I mixer 220a may downconvert an attenuated RF signal to generate an I component signal. The feedback Q mixer 220b may downconvert the attenuated RF signal to generate a Q component signal. The I HPVGA 228a may receive input signals from the feedback I mixer 220a, while the Q HPVGA 228b may receive input signals from the feedback Q mixer 220b.

The I LPF 230a may filter the amplified signal received from the I HPVGA 228a such that the output of the I LPF 230a may be based on an analog baseband component of the amplified signal received from the I HPVGA 228a. Similarly, the Q LPF 230b may generate an analog baseband signal.

One possible limitation of the PA circuits 214a and/or 214b is that the output signal may become increasingly distorted as the output power levels from the PA circuits 214a and/or 214b increase. The distortion may be detected through AM-AM distortion measurements, and/or AM-PM distortion measurements.

In various embodiments of the invention, the calibration mode may enable the baseband processor 240 to compensate for AM-AM distortion and/or AM-PM distortion. In one aspect of the invention, the calibration mode may enable the baseband processor 240 to send input digital baseband signals $I_{BB}$ and $Q_{BB}$ to the multiband RF transmitter 123b, from which a plurality analog RF output signals may be generated. An analog RF output signal may be selected by the switch 235 and subsequently attenuated by the signal attenuation block 218, and downconverted by the feedback I mixer 220a and/or the feedback Q mixer 220b. The downconverted signal generated by the feedback I mixer 220a may comprise an I signal component derived from the selected RF output signal, while the downconverted signal generated by the feedback Q mixer 220b may comprise a Q signal component. The downconverted signal from the feedback I mixer 220a may be inserted into the multiband RF receiver 123a path as a feedback signal, $I_F$, input to the I HPVGA 228a, while the downconverted signal from the feedback Q mixer 220b may be inserted into the multiband RF receiver 123a path as a feedback signal, $Q_F$, input to the Q HPVGA 228b. The feedback signals, $I_F$ and $Q_F$, may be processed within the multiband RF receiver 123a path and received as digital baseband signals, $I_{FB}$ and/or $Q_{FB}$ respectively, at the baseband processor 240.

Based on the digital baseband signals $I_{BB}$ and $Q_{BB}$, and the feedback digital baseband signals $I_{FB}$ and $Q_{FB}$, the baseband processor 240 may estimate AM-AM and/or AM-PM distortion in the RF output signals, $RF_{out1}$ and/or $RF_{out2}$, from the multiband RF transmitter 123b. Based on the AM-AM and/or AM-PM distortion estimates, the baseband processor 240 may predistort subsequent digital baseband signals $I_{BB}$ and/or $Q_{BB}$. By predistorting the digital baseband signals $I_{BB}$ and/or $Q_{BB}$, the baseband processor 240 may linearize the PA circuits 214a and/or 214b in the multiband RF transmitter 123b. By linearizing the PA circuits 214a and/or 214b, the analog RF output signals, $RF_{out1}$ and/or $RF_{out2}$, generated by the PA circuits 214a and 214b may change linearly in response to changes in the undistorted digital baseband signals $I_{BB}$ and $Q_{BB}$ from the baseband processor 240.

In various embodiments of the invention, digital predistortion may be utilized to linearize the PA circuits 214a and/or 214b, which may thereby enable the PA circuits 214a and/or 214b to transmit signals at higher average output power levels while still complying with relevant EVM specifications, for example. Further details describing exemplary methods of calibration for digital predistortion are disclosed in U.S. patent application Ser. No. 11/618,876 filed Dec. 31, 2006, which is hereby incorporated herein in its entirety.

Figure 4:
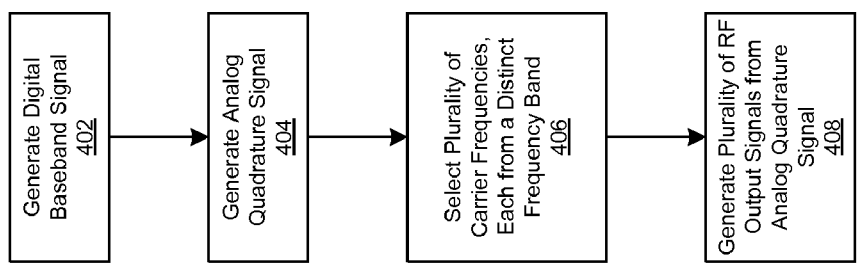
FIG. 4 is a flowchart illustrating exemplary steps for generating a plurality of output RF signals in a multiband RF transmitter, in accordance with an embodiment of the invention.

FIG. 4 is a flowchart illustrating exemplary steps for generating a plurality of output RF signals in a multiband RF transmitter, in accordance with an embodiment of the invention. Referring to FIG. 4, in step 402, the baseband processor 240 may generate a digital baseband signal. In step 404, the transconductance stage 250 may generate an analog quadrature signal based on the digital baseband signal. In step 406, a processor 125 may select a plurality of carrier frequencies. Each carrier frequency may be selected from a distinct frequency band. The number of selected carrier frequencies may be equal to the number of gain stages 252a and 252b. In step 408, each gain stage 252a and 252b may generate an analog RF output signal. Each analog RF output signal may be generated by utilizing a distinct carrier frequency from the plurality of carrier frequencies selected in step 406.

Various aspect of a system for a linearized transmitter including a power amplifier may include at least one transconductance amplifier 206a that enables generation of a single analog quadrature signal. Transmitter mixers 208a, 208b, 208c and 208d may enable generation of a plurality of upconverted RF signals in a corresponding plurality of RF processing chains based on the generated single analog quadrature signal. In various embodiments of the invention, a gain stage, for example gain stage 252, may also be referred to as an RF processing chain. Power amplifier circuit 214a and 214b may enable generation of a corresponding plurality of RF output signals within a mobile terminal 120 based on the generated plurality of upconverted RF signals.

The single analog quadrature signal may comprise an in-phase component and a quadrature-phase component. The transmitter mixers 208a, 208b, 208c and 208d may enable generation of the plurality of each of the plurality of upconverted RF signals based on the generated single analog quadrature signal and a selected center frequency. The selected center frequency may be selected from a frequency range. The frequency range may be distinct from a previous frequency range and/or a subsequent frequency range utilized for generating a previous one of the plurality of upconverted RF signals and/or a subsequent one of the plurality of upconverted RF signals. Tunable capacitors 223a and 223d may enable independent adjustment of a center frequency for each of the generated plurality of upconverted RF signals. The independent adjustment increases, decreases or leaves unchanged, the center frequency for each of the generated plurality of upconverted RF signals.

One or more sets of RFPGA circuits 210a and 210b may enable generation of a first stage amplified signal based on each of the generated a plurality of first stage amplified signals each based on a corresponding one of the generated plurality of upconverted RF signals following the independent adjustment of the center frequency. Tunable capacitors 223b and 223e may enable independent adjustment of a center frequency for each of the plurality of first stage amplified signals. The independent adjustment increases, decreases or leaves unchanged, the center frequency for each of the plurality of first stage amplified signals.

One or more sets of PAD circuits 212a and 212b may enable generation of one or more pluralities of subsequent stage amplified signals based on the generated plurality of first stage amplified signals following the independent adjustment of the center frequency for each of the plurality of generated first stage amplified signals. At least one set of tunable capacitors 223c and 223f may enable independent adjustment of a center frequency for each of the generated one or more pluralities of subsequent stage amplified signals. The independent adjustment increases, decreases or leaves unchanged, the center frequency for each of the generated one or more pluralities of subsequent stage amplified signals.

PA circuits 214a and 214b may enable generation of each of the corresponding plurality of RF signals based on a corresponding last of the generated one or more pluralities of subsequent stage amplified signals following independent adjustment of the center frequency for each of the generated one or more pluralities of subsequent stage amplified signals. The PA circuits 214a and 214b may enable transmission of at least a portion of the generated corresponding plurality of RF signals via a wireless communication medium.

A switch 235 may enable selection of one or the corresponding plurality of generated RF output signals. Feedback mixer circuits 220a and 220b may enable generation of one or more feedback signals by performing a frequency downconversion operation on the selected one of the corresponding plurality of generated RF output signals. An I path selector switch 234a and/or Q path selector switch 234b may enable insertion of the generated feedback signals at corresponding insertions point(s) in a multiband RF receiver 123a. Each insertion point may be between a corresponding receiver mixer circuit 226a, 226b, 226c and/or 226d, and a corresponding one or more circuits, 228a, 230a and 232a for example, that generates a based band signal corresponding to one of the generated feedback signals. Transconductance amplifiers 206a and 206b may enable generation of the single quadrature signal in a single transconductance stage circuit 250.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for wireless communication, the method comprising:
  in a chip comprising a plurality of RF transmitters and a plurality of RF receivers:
    generating a single analog quadrature signal using a baseband processor;
    generating one or more output RF signals based on said generated single analog quadrature signal in a corresponding one or more of said plurality of RF transmitters; and
    communicating one or more of said output RF signals to one or more of said plurality of RF receivers via a feedback path comprising circuitry external to said plurality of RF receivers.

2. The method according to claim 1, wherein said circuitry comprises a transmit/receive switch.

3. The method according to claim 1, wherein said circuitry comprises a balun.

4. The method according to claim 3, wherein said balun is integrated external to said chip.

5. The method according to claim 3, wherein said balun is integrated in said chip.

6. The method according to claim 1, wherein said single analog quadrature signal comprises an in-phase component and a quadrature-phase component.

7. The method according to claim 1, comprising down-converting said output RF signal communicated via said feedback path utilizing one or more mixers in said one or more RF receivers.

8. The method according to claim 1, comprising communicating said down-converted output RF signals to said baseband processor.

9. The method according to claim 1, comprising estimating distortion in said generated single analog quadrature signal utilizing said communicated down-converted output RF signals.

10. The method according to claim 1, comprising predistorting subsequently generated single analog quadrature signals based on said distortion estimation.

11. A system for wireless communication, the system comprising:
  one or more circuits for use in a wireless device, said one or more circuits in a chip comprising a plurality of RF transmitters and a plurality of RF receivers are operable to:
    generate a single analog quadrature signal using a baseband processor;
    generate one or more output RF signals based on said generated single analog quadrature signal in a corresponding one or more of said plurality of RF transmitters; and
    communicate one or more of said output RF signals to one or more of said plurality of RF receivers via a feedback path comprising circuitry external to said plurality of RF receivers.

12. The system according to claim 11, wherein said circuitry comprises a transmit/receive switch.

13. The system according to claim 11, wherein said circuitry comprises a balun.

14. The system according to claim 13, wherein said balun is integrated external to said chip.

15. The system according to claim 13, wherein said balun is integrated in said chip.

16. The system according to claim 11, wherein said single analog quadrature signal comprises an in-phase component and a quadrature-phase component.

17. The system according to claim 11, wherein said one or more circuits are operable to down-convert said output RF signal communicated via said feedback path utilizing one or more mixers in said one or more RF receivers.

18. The system according to claim 17, wherein said one or more circuits are operable to communicate said down-converted output RF signals to said baseband processor.

19. The system according to claim 11, wherein said one or more circuits are operable to estimate distortion in said generated single analog quadrature signal utilizing said communicated down-converted output RF signals.

20. The system according to claim 11, wherein said one or more circuits are operable to predistort subsequently generated single analog quadrature signals based on said distortion estimation.

* * * * *